United States Patent
van Zeijl

(10) Patent No.: US 7,109,795 B2
(45) Date of Patent: Sep. 19, 2006

(54) AMPLIFIER-MIXER DEVICE

(75) Inventor: Paulus Thomas M. van Zeijl, Hengelo (NL)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 21 days.

(21) Appl. No.: 10/473,802

(22) PCT Filed: Apr. 2, 2002

(86) PCT No.: PCT/NL02/00209

§ 371 (c)(1),
(2), (4) Date: Dec. 2, 2003

(87) PCT Pub. No.: WO02/082635

PCT Pub. Date: Oct. 17, 2002

(65) Prior Publication Data

US 2004/0113679 A1    Jun. 17, 2004

(30) Foreign Application Priority Data

Apr. 4, 2001  (NL) ................................. 1017773

(51) Int. Cl.
*H03F 3/45* (2006.01)
(52) U.S. Cl. .................... 330/254; 330/260; 327/359
(58) Field of Classification Search ................ 330/254, 330/278; 455/333; 327/359
See application file for complete search history.

(56) References Cited

U.S. PATENT DOCUMENTS

| | | | |
|---|---|---|---|
| 3,614,668 A | 10/1971 | Toshiaki | |
| 5,438,693 A | 8/1995 | Cox | |
| 5,973,576 A | 10/1999 | Ariie | |
| 6,023,192 A * | 2/2000 | Didier | 330/254 |
| 6,094,084 A * | 7/2000 | Abou-Allam et al. | 327/359 |
| 6,147,559 A * | 11/2000 | Fong | 330/311 |
| 6,175,438 B1 * | 1/2001 | Agarwal et al. | 330/308 |
| 6,342,813 B1 * | 1/2002 | Imbornone et al. | 330/254 |
| 6,347,221 B1 * | 2/2002 | Tsukahara et al. | 455/333 |
| 6,404,263 B1 * | 6/2002 | Wang | 327/359 |

(Continued)

FOREIGN PATENT DOCUMENTS

EP    0 289 099    11/1988

(Continued)

OTHER PUBLICATIONS

Muys, *Een bipolaire schakelende mixer met overall tegenkoppeling* (*A bipolar switching mixer with overall feedback*), Technische Universiteit Delft, Faculteit Elektrotechniek, Vakgroup Elektronica, graduate report No. 68360/1990-10, Aug. 1990.

(Continued)

*Primary Examiner*—Khanh Van Nguyen
(74) *Attorney, Agent, or Firm*—Nixon & Vanderhye P.C.

(57) ABSTRACT

An amplifier mixer device includes an amplifier structure having at least one amplifier input and at least one amplifier output. At least one of the amplifier outputs is looped back via a feedback to at least one of the amplifier inputs. The amplifier structure includes a mixer structure. The mixer structure comprises at least one switch having a switch input communicatively connected with the radio input, and a switch output communicatively connected with the mixer output. The switch input and switch output in a conducting state of the switch are electrically connected with each other and in a non-conducting state of the switch are electrically substantially not connected with each other. In use, the switch is switched from the conducting state to the non-conducting state and vice versa with the local oscillator signal.

15 Claims, 2 Drawing Sheets

U.S. PATENT DOCUMENTS 6,489,847 B1 * 12/2002 van Zeijl ................... 330/255
6,704,559 B1 *  3/2004 Hageraats ................. 455/326

FOREIGN PATENT DOCUMENTS

EP         0 308 273       3/1989

OTHER PUBLICATIONS

E.H. Nordholt, "*Design of High-Performance Negative Feedback Amplifiers,*" Delft University Press, Delft, The Netherlands, © 1993.

* cited by examiner

AMPLIFIER-MIXER DEVICE

This is U.S. National stage application of International PCT Application No. PCT/NL02/00209 filed on Apr. 2, 2002, claiming priority from Netherlands Patent Application No. 1017773, filed on Apr. 4, 2001, the contents of these applications are being incorporated here by reference.

BACKGROUND

The invention relates to an amplifier-mixer device comprising: an amplifier structure having at least one amplifier input and at least one amplifier output, while at least one amplifier output is looped back via a feedback to at least one amplifier input, which amplifier structure comprises a mixer structure, having at least one radio input communicatively connected with the amplifier input, for receiving a signal of a radio frequency; at least one local input for receiving a local oscillator signal; and at least one mixer output for providing a signal of a medium frequency.

Such an amplifier-mixer device is known from the Dutch-language publication: "*A bipolar switching mixer with over-all feedback*", W. Muys, graduate report 68360/1990-10, Delft University of Technology 1989.

In the known amplifier-mixer device, the amplifier structure is designed as a two-stage amplifier in which a Common Base (CB) bipolar junction transistor (BJT), of which the collector and emitter form the amplifier output, is replaced by a mixer structure. The mixer structure is designed as a Gilbert Cell mixer and comprises two BJTs whose emitters are connected to each other. Of each of the BJTs, the base is connected to a separate local oscillator source. These local oscillator sources are connected to each other through a side not connected to any of the bases, and operate in opposite phase. The mutually connected sides of the local oscillator sources in the amplifier, as it were, replace the base of the CB bipolar transistor. The collectors of the BJTs constitute the positive and the negative junction, respectively, of the medium frequency output.

A drawback of this known amplifier-mixer device is the energy consumption. This is disadvantageous specifically in applications with a limited source power, such as mobile telephones, radios or other wireless applications. Moreover, the known amplifier-mixer device is comparatively complex.

SUMMARY

It is an object of the invention to provide an amplifier-mixer device which obviates these drawbacks. To that end, the invention contemplates the provision of an amplifier-mixer device which has a lower energy consumption and has comparatively few components. According to the invention, an amplifier-mixer device as described above is characterized, according to the invention, in that the mixer structure comprises: at least one switch having a switch input which is communicatively connected with the radio input and a switch output which is communicatively connected with the mixer output, which switch input and switch output in a conducting state of the switch are electrically connected with each other and in a non-conducting state of the switch are electrically substantially not connected with each other and which switch in use is switched from the conducting state to the non-conducting state and vice versa with the local oscillator signal.

Such an amplifier-mixer device has a lower energy consumption because virtually no bias current flows through the switches and the switches use power virtually exclusively when being set from the non-conducting state into the conducting state or vice versa. Moreover, in the device, for the operation of the mixer structure, in contrast to the Gilbert Cell mixer structure in the known amplifier-mixer device, no bias current source for the mixer structure needs to be used. Consequently, the number of components in the circuit is reduced, so that both the energy consumption and the complexity of the amplifier-mixer device decrease. Also, an amplifier-mixer according to the invention is simpler to implement in a single integrated circuit, with, for instance, all transistors being designed as field effect transistors (FETs) and the other components being exclusively of a passive type, such as resistors, coils and capacitors.

BRIEF DESCRIPTION OF DRAWINGS

Further aspects, details and embodiments of the invention will be discussed with reference to the figures shown in the drawings.

DETAILED DESCRIPTION

In the following description, use has been made of the concept of a nullor. This concept will be explained below with reference to the twoport shown in FIG. 1. The twoport shown in FIG. 1 has an input with a positive input contact $i^+$ and a negative input contact $i^-$. An output of the twoport is formed by a positive output contact $u^+$ with a negative output contact $u^-$. The parameters A, B, C and D are defined by the following equations:

$$1/A = \left(\frac{U_u}{U_i}\right)_{I_u=0} \text{ (voltage gain);}$$

$$1/B = \left(\frac{I_u}{U_i}\right)_{U_u=0} \text{ (transadmittance);}$$

$$1/C = \left(\frac{U_u}{I_i}\right)_{I_u=0} \text{ (transimpedance);}$$

$$1/D = \left(\frac{I_u}{I_i}\right)_{U_u=0} \text{ (current gain).}$$

Here, $U_i$ is the voltage difference of the input signal between the positive input contact $i^+$ and the negative input contact $i^-$. $I_i$ is the current of the input signal in the direction of the arrow indicated with $I_i$. $U_u$ is the voltage difference of the output signal between the positive output contact $u^+$ and the negative output contact $u^-$. $I_u$ is the current of the output signal in the direction of the arrow indicated with $I_u$. The relation between the input and output signals can be described by the matrix equation below:

$$\begin{bmatrix} U_i \\ I_i \end{bmatrix} = \begin{bmatrix} A & B \\ C & D \end{bmatrix} \begin{bmatrix} U_u \\ I_u \end{bmatrix}$$

It can be derived that the input and output impedances equal:

$$Z_i = \frac{AZ_l + B}{CZ_l + D}$$

$$Z_u = \frac{DZ_s + B}{CZ_s + A}$$

In these impedance equations, $Z_i$ is the input impedance of the twoport; $Z_u$ is the output impedance of the twoport; $Z_l$ is the load impedance and $Z_s$ is the source impedance.

Figure 1:
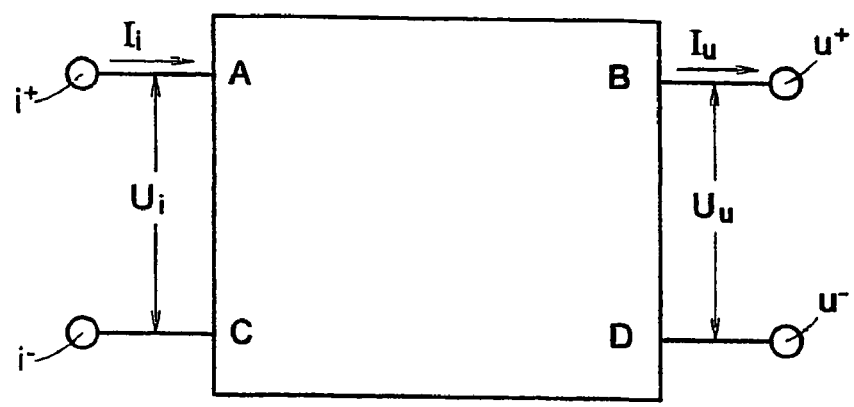
FIG. 1 shows a block diagram of a twoport device.

In the present application, a nullor is understood to mean: a twoport of the type shown in FIG. 1, with the parameters A, B, C and D being substantially infinitely small or to be so considered in the specific implementation.

Figure 2:
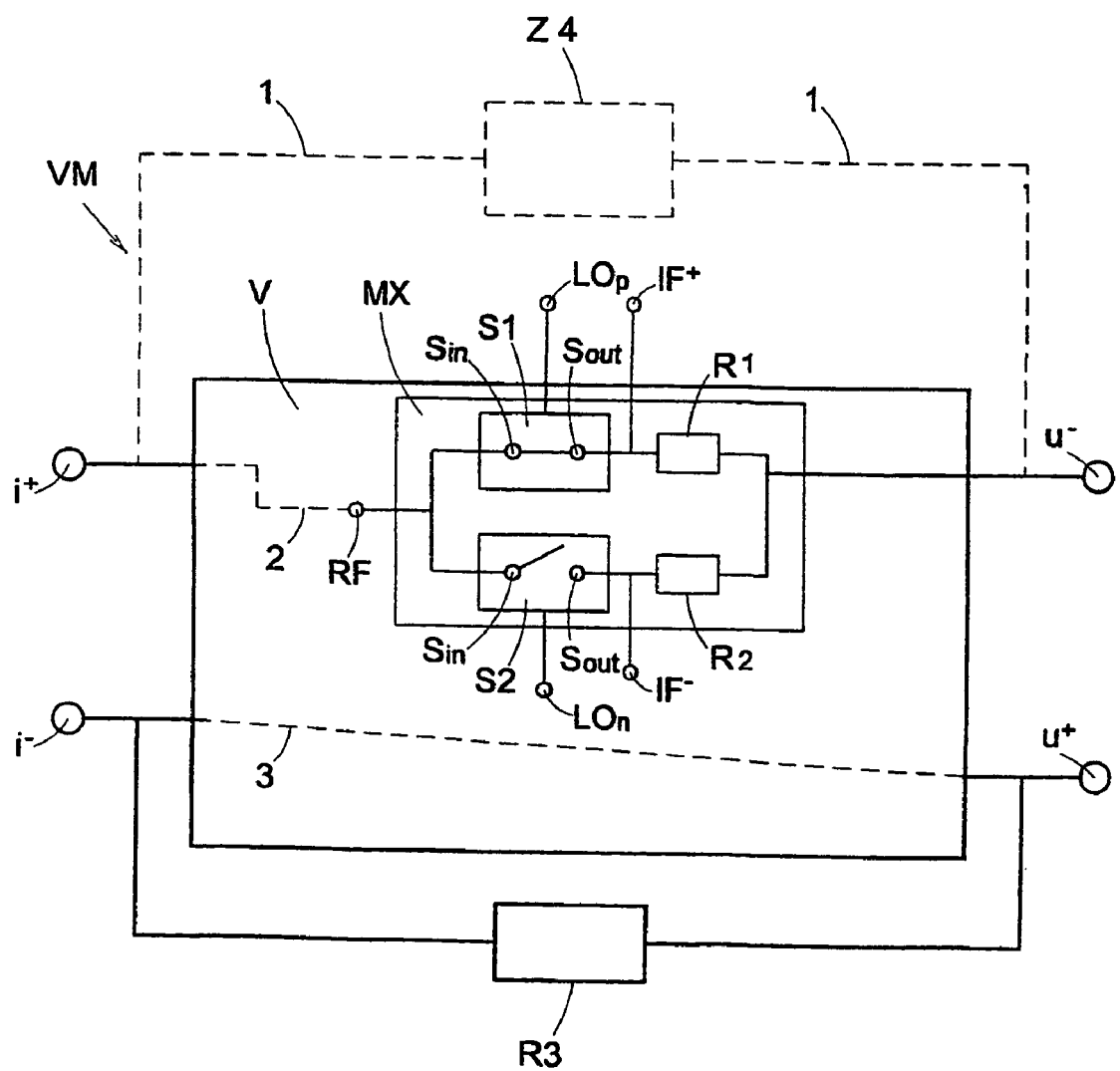
FIG. 2 shows a block diagram of a first example of an embodiment of an amplifier-mixer device according to the invention.

In FIG. 2 an amplifier-mixer device VM is shown. The amplifier-mixer device VM comprises an amplifier structure V. The amplifier structure V has an amplifier input and an amplifier output. The amplifier input is formed by a positive input contact $i^+$ and a negative input contact $i^-$. To the amplifier input a radio-frequency (r.f.) signal can be presented. The r.f. signal can be presented to the amplifier input contacts $i^+$, $i^-$ as an electric current or a voltage difference between the positive input contact $i^+$ and the negative input contact $i^-$. The amplifier structure proceeds to amplify the r.f. signal and outputs it to the amplifier output of the amplifier structure V which is formed by a positive output contact $u^+$ and a negative output contact $u^-$.

The amplifier structure can be any kind of amplifier structure, for instance a differential amplifier, a power amplifier, a transadmittance amplifier or a transconductance amplifier.

The positive output contact $u^+$ has been looped back via a resistor R3 to the negative input contact $i^-$. It is also possible, instead or in addition, to loop the negative output contact back to the positive input contact, optionally via a coupling impedance Z4, as is represented in FIG. 2 with dotted lines 1. It will be clear that the feedback can be of any type and that the feedback can be direct or indirect, with one or more coupling elements.

The amplifier structure V comprises a mixer structure MX. The r.f. signal that is presented to the amplifier input contacts $i^+$,$i^-$ is passed, in the interior of the amplifier structure V, to a radio input RF of the mixer structure MX, as is indicated with dotted lines 2,3. In the mixer, the r.f. signal is mixed with a local oscillator (l.o.) signal. This mixing results in a signal of medium or intermediate frequency (i.f.), which is presented to a mixer output. In the amplifier-mixer device shown in FIG. 2, the mixer output is formed by a positive i.f. contact $IF^+$ and a negative i.f. contact $IF^-$.

The mixer structure MX comprises two switches S1 and S2. The switches S1, S2 each have a switch input Sin and a switch output Sout. The switch inputs Sin are communicatively connected with the radio input of the mixer structure MX, so that the r.f. signal is passed to the switches. In the figure, the switch S1 is in a conducting state in which the switch input Sin is conductively connected with the switch output Sout, while the switch S2 is in a non-conducting state in which the switch input Sin has no conductive connection with the switch output Sout. In use, the switches are switched from one state to the other state and vice versa with a local oscillator signal by the LO signal that is passed to the switches via a positive local contact LOp and a negative local contact LOn. As a result, the signal that is presented to the switch inputs Sin is mixed with the local oscillator signal, which results in an i.f. signal. This signal can be tapped at the switch outputs Sout and be further used via the mixer output contacts $IF^-$ and $IF^+$. It will be clear that the specific manner in which switching is carried out depends on the type of switch used in the mixer structure.

By the use of a mixer structure with switches, the mixer structure consumes power virtually exclusively if the switches are in the conducting state. Moreover, such a mixer structure does not need any bias current, and no bias current source is needed. Also, such a structure has the properties of a nullor. This makes it relatively simple to describe the amplifier characteristic and implement it in a circuit.

It will be clear that the Gilbert cell used in the known amplifier-mixer device functions only if through the mixer transistors a bias current flows from the collector to the emitter. This bias current is a direct current and is obtained by a bias current source connected to the emitters. If to the bases of the mixer transistors in the Gilbert cell the LO signal is presented and at the emitters the r.f. signal is superposed on the bias current, then on the collector side the i.f. signal will be obtained in the form of a current superposed on the bias current. The use of a mixer structure according to the invention makes it possible to omit the bias current source because the r.f. signal is mixed by bringing the switches from the conducting state into the non-conducting state and vice versa.

The switch outputs Sout of the switches S1 and S2 are coupled to each other through resistors R1 and R2. The switches are switched substantially in opposite phase with respect to each other, so that at the mutually coupled contacts of the resistors R1 and R2 an r.f. signal is obtained which can be outputted to the amplifier output, in the figure to the positive output $u^+$. It will be clear that it is possible to combine the signals in a different manner, for instance by means of coils, capacitors, additional amplifier stages or other more complex electrical components.

Figure 3:
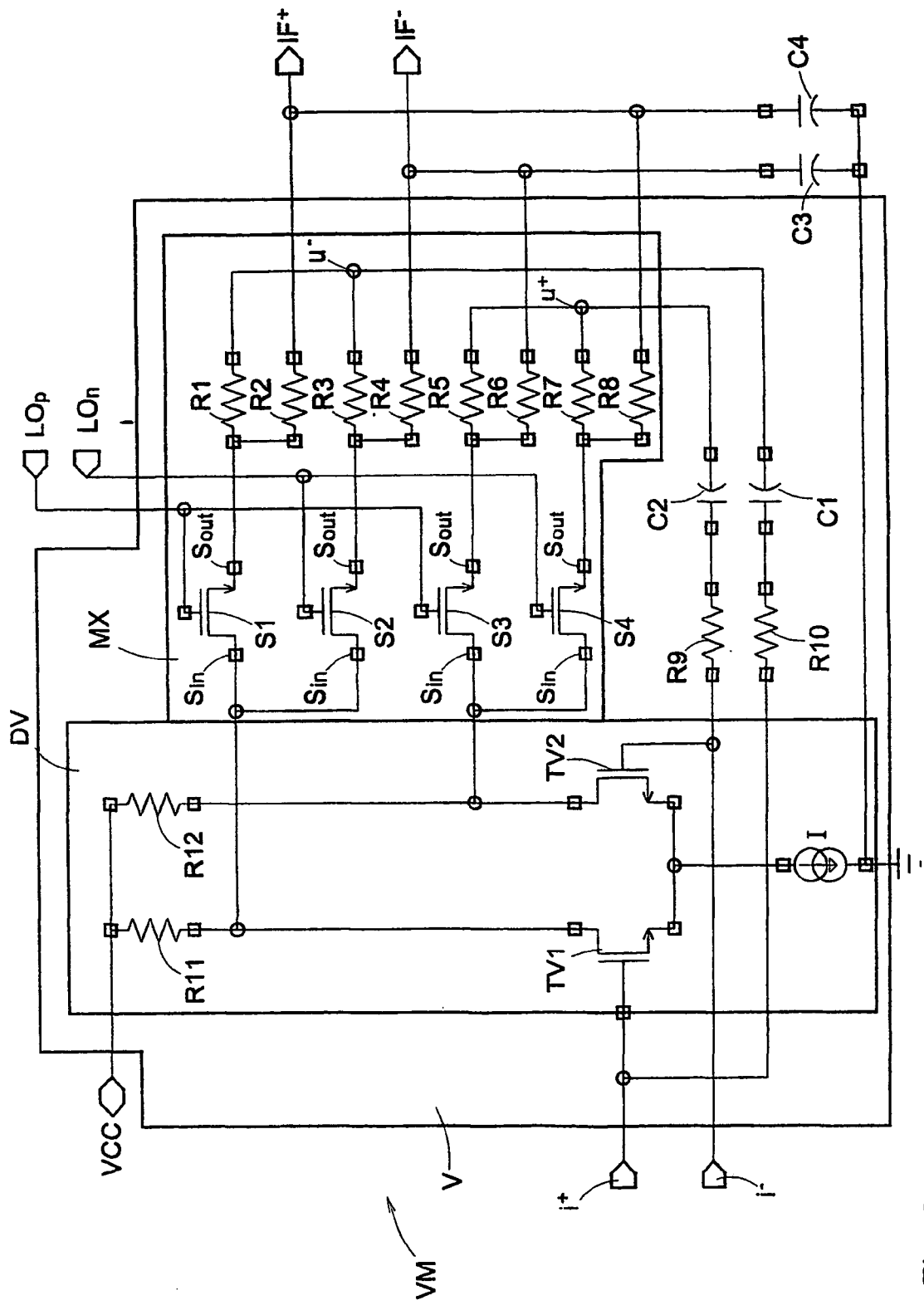
FIG. 3 shows a circuit diagram of a second example of an embodiment of an amplifier-mixer device according to the invention.

In the second example of an embodiment of an amplifier-mixer device according to the invention shown in FIG. 3, the switches are designed as field effect transistors (FETs). In the amplifier-mixer device VM shown in FIG. 3, the amplifier structure V is a two-stage amplifier, in which a first stage is formed by a differential amplifier DV, and a second stage by the mixer structure MX.

The differential amplifier DV is formed by two n-type Metal Oxide Silicon (MOS) FETs TV1 and TV2, whose sources are connected with each other and a current source I. The drains of the transistors TV1 and TV2 are connected through resistors R11 and R12, respectively, with a supply voltage VCC and form the output contacts of the first amplifier stage. The gates of the transistors form the input contacts $i^+$,$i^-$ of the amplifier-mixer device.

The drains of the transistors TV1 and TV2 are each connected to a respective pair of switches S1, S2, and S3, S4 of the mixer structure MX. The switches S1–S4 are N MOS-FETs, whose voltage across the gate is switched with the local frequency. The voltage across the gate is then set such that the FETs S1–S4 are operative in the triode range, so that the FETs function as switch. The switch inputs Sin are formed by the drains of the FETs and the switch outputs Sout are formed by the sources. Of each respective transistor pair S1, S2, and S3, S4, the transistors are switched in opposite phase with respect to each other, in that the gate of one transistor is connected to the negative local contact LOn and the gate of the other transistor is connected to the positive local contact LOp. Resistors R1, R3 and R5, R7, respectively, combine the i.f. signals of each pair similarly to the resistors R1 and R2 in FIG. 2, so that the mutually connected contacts of the resistors R1, R3 and R5, R7 respectively form the negative output contact u⁻ and the positive output contact u⁺ of the two-stage amplifier. At these output contacts, the amplified r.f. signal is available. In the amplifier-mixer device VM shown in FIG. 3, the negative output contact u⁻ and the positive output contact u⁺, respectively, are coupled back to the input contacts i⁺ and i⁻, respectively, via resistor R10 and capacitor C1, and resistor R9 and capacitor C2. Capacitors C1 and C2 in the feedback ensure that no bias current flows through the FETs S1–S4.

Due to the amplifier transistors TV1 and TV2 being switched in opposite phase (the r.f signal presented to the input contacts i⁺,i⁻ is balanced), the i.f. signals of the FETs S1 and S4 have the same phase. The signal coming from FET S4 is switched with twice a 180 degree phase difference with respect to the FET S1 signal: a first time with 180 degrees phase difference by FET TV2 with respect to FET S1 and a second time with 180 degrees phase difference by the negative local input contact LOn with respect to the positive local input contact LOp. This results in a total phase difference of 360 degrees, which is equivalent to a phase shift of 0 degrees. Similarly, the i.f. signals of the FETs S2 and S3 are equal in phase, having a phase difference of 180 degrees with the i.f. signal of the FETs S1 and S4. Consequently, the i.f. signals of equal phase can be combined. This has been implemented in the device in FIG. 3 by the resistors R2, R8 and R4, R6, respectively. As a result, a balanced i.f. signal is obtained at the mixer output.

Both mixer output contacts IF⁻, IF⁺ are grounded via a capacitor C3 and C4, respectively, so that undesired frequency components are filtered from the i.f. signal.

The invention is not limited to the embodiments shown. After the foregoing, different variants will readily occur to those skilled in the art. It will be clear that the input contacts and output contacts may be connected with each other in any manner. In particular, it will be readily understood the contacts can be designed in the manners as known from E. H. Nordholt, "*The design of high performance negative feedback amplifiers*" and the manners known from the Dutch-language patent publication 87 01026, incorporated into this application by reference.

It will also be obvious to design transistors in the amplifier device and/or the mixer structure in a complementary version, with, for instance, the N-type FETs replaced with P-type FETs and vice versa. Also, it will be obvious to substitute transistors of a particular type by a different type, for instance FET by BJT. It is likewise obvious to replace the resistors shown with capacitances and inductances. Also, it will be clear to those skilled in the art that the amplifier structure and/or the mixer structure can be designed in a different manner, for instance by adding extra amplifier stages in the form of transistors or adding extra nullors. Additionally, it is not necessary to design the amplifiers as nullors.

The invention is not limited to an integrated circuit or a particular topology. In particular, an amplifier-mixer device according to the invention can be designed as an assembly of discrete components or an at least partly integrated circuit of Complementary Metal Oxide Silicon (CMOS), merged CMOS and bipolar (Bi-CMOS), Silicon Germanium (SiGe), Gallium Arsenide (GaAs) or similar structures.

Also, it will be obvious to realize the summation of RF and IF signals not with resistors but with, for instance, active components such as MOS or BJT devices.

The invention claimed is:

1. An amplifier-mixer device comprising:
   an amplifier structure having:
      at least one amplifier input for receiving an input signal and
      at least one amplifier output for outputting an amplified signal, while at least one amplifier output is coupled back via a feedback to at least one amplifier input, which amplifier structure comprises a mixer structure for mixing said input signal with a local oscillator signal, said mixer structure having:
      at least one radio input communicatively connected to the amplifier input, for receiving said input signal;
      at least one local oscillator input for receiving a local oscillator signal; and
      at least one mixer output for providing an intermediate frequency signal resulting from said mixing,
   wherein the mixer structure comprises:
      at Least one switch having:
         a switch input communicatively connected with the radio input and
         a switch output communicatively connected with the mixer output, which switch input and switch output in a conducting state of the switch are electrically connected with each other and in a non-conducting state of the switch are electrically substantially not connected with each other, which at least one switch including a switch control,connected to said local oscillator input, for switching said switch from the conducting state to the non-conducting state and vice versa wit the local oscillator signal.

2. An amplifier-mixer device according to claim 1, wherein the mixer structure comprises at least one first switch and at least one second switch, which at least one first switch is connected to a first local oscillator input and which at least one second switch is connected to a second local oscillator input for switching, based on the local oscillator signal, said first switch and said second switch from the conducting state to the non-conducting state and vice versa with said second switches substantially in opposite phase with respect to said at least one first switches, and
   wherein said at least one first switch has a first switch output and said at least one second switch has a second switch output, which first switch output is connected to said second switch output via at least one connecting component, and
   wherein an output of at least one of the at least one connecting component forms at least one of the amplifier outputs.

3. An amplifier-mixer device according to claim 2, wherein the amplifier structure comprises a differential amplifier, said differential amplifier including at least one input connected to the at least one amplifier input and in which amplifier structure said mixer structure comprises at least four switches, of which at least four switches at least one first pair of a first switch and a second switch is connected to a positive output contact of the differential amplifier and at least one second pair of a first switch and a second switch is connected to a negative output contact of the differential amplifier.

4. An amplifier-mixer device according to claim 1, wherein the amplifier structure comprises a first amplifier and a second amplifier and wherein an input of the first amplifier forms a first input of the amplifier structure and an input of the second amplifier forms a second input of the amplifier structure.

5. An amplifier-mixer device according to claim 4, wherein the first amplifier and the second amplifier are connected with each other while balanced.

6. An amplifier-mixer device according to claim 1, wherein a positive input of the amplifier structure is connected by a first cross coupling with a negative output of the amplifier structure, and optionally, a negative input of the amplifier structure is connected by a second cross coupling with a positive output of the amplifier structure.

7. An amplifier-mixer device according to claim 1, wherein said feedback includes exclusively passive electronic components.

8. An amplifier-mixer device according to claim 1, wherein the amplifier structure is substantially desired as at least one nullor structure.

9. An amplifier-mixer device according to claim 1, wherein at least one of the switches is a FET transistor, of which the gate forms the local oscillator input and the source and the drain form the switch input and the switch output, respectively.

10. An amplifier mixer device according to claim 5, wherein an input or an output of the first amplifier is coupled wit a corresponding input or output of the second amplifier.

11. An amplifier mixer device according to claim 5, wherein an output of the first amplifier is coupled with an output of the second amplifier to form a mixer output contact.

12. An amplifier mixer device according to claim 11, wherein the mixer structure comprises:
at least one first switch connected to said output of the first amplifier; and
at least one second switch connected to said output of said second amplifier, which at least one first switch is connected to a first local oscillator input which at least one second switch is connected to a second local oscillator input, for switching, with the local oscillator signal, said at least one first switch and said at least one second switch from the conducting state to the non-conducting state and vice versa with said at least one second switch substantially in opposite phase with respect to said at least one first switch, and
wherein said at least one first switches have first switch outputs and said at least one second switches have second switch outputs which first switch outputs are connected to said second switch outputs, for forming said mixer output contact.

13. An amplifier-mixer according to claim 1, wherein said input signal and said amplified signal are radio frequency signals.

14. An amplifier mixer device according to claim 2, wherein:
said first switch output is connected to at least one first connecting component;
said second switch output is connected to at least one second connecting component;
said first connecting component and said connecting component are connected to each other at a node; and
said node forms at least one of the amplifier outputs.

15. A method for amplifying and mixing a signal, comprising:
amplifying an input signal, comprising:
receiving the input signal;
amplifying the input signal to form an amplified signal;
outputting the amplified signal as output signal;
feeding back the output signal as input signal;
said amplifying further comprising:
receiving a local oscillator signal of local oscillator frequency;
mixing the input signal with the local oscillator signal to form an intermediate frequency signal and outputting the intermediate frequency signal;
wherein said mixing comprises:
switching with the local oscillator signal at least one switch from a conducting state of the switch to a non-conducting state of the switch and vice versa, in which conducting state a switch input where the input signal of radio is presented and a switch output where the intermediate frequency signal is outputted are electrically connected with each other, and in which non-conducting state the switch input and the switch output are electrically substantially not connected with each other.

* * * * *

UNITED STATES PATENT AND TRADEMARK OFFICE
CERTIFICATE OF CORRECTION

PATENT NO. : 7,109,795 B2 Page 1 of 1
APPLICATION NO. : 10/473802
DATED : September 19, 2006
INVENTOR(S) : van Zeijl It is certified that error appears in the above-identified patent and that said Letters Patent is hereby corrected as shown below:

In Column 6, Line 32, in Claim 1, delete "wit" and insert -- with --, therefor.

In Column 7, Line 14, in Claim 8, delete "desired" and insert -- designed --, therefor.

In Column 7, Line 23, in Claim 10, delete "wit" and insert -- with --, therefor.

In Column 8, Line 36, in Claim 15, after "signal" delete "of radio".

Signed and Sealed this

Tenth Day of November, 2009

David J. Kappos
*Director of the United States Patent and Trademark Office*